(12) United States Patent
Yang et al.

(10) Patent No.: US 7,423,335 B2
(45) Date of Patent: Sep. 9, 2008

(54) SENSOR MODULE PACKAGE STRUCTURE AND METHOD OF THE SAME

(75) Inventors: Wen-Kun Yang, Hsin-Chu (TW); Jui-Hsien Chang, Jhudong Township, Hsinchu County (TW)

(73) Assignee: Advanced Chip Engineering Technology Inc., Hsinchu County (TW)

( * ) Notice: Subject to any disclaimer, the term of this patent is extended or adjusted under 35 U.S.C. 154(b) by 0 days.

(21) Appl. No.: 11/954,087

(22) Filed: Dec. 11, 2007

(65) Prior Publication Data

US 2008/0157250 A1 Jul. 3, 2008

Related U.S. Application Data

(63) Continuation-in-part of application No. 11/647,217, filed on Dec. 29, 2006, and a continuation-in-part of application No. 11/933,703, filed on Nov. 1, 2007, which is a continuation-in-part of application No. 11/648,688, filed on Jan. 3, 2007, and a continuation-in-part of application No. 11/694,719, filed on Mar. 30, 2007.

(51) Int. Cl.
*H01L 23/02* (2006.01)
*H01L 29/22* (2006.01)
*H01L 29/227* (2006.01)
*H01L 33/00* (2006.01)
*H01L 23/34* (2006.01)
*H01L 23/48* (2006.01)
*H01L 23/52* (2006.01)
*H01L 29/40* (2006.01)

(52) U.S. Cl. .......................... 257/680; 257/98; 257/99; 257/685; 257/686; 257/723; 257/777

(58) Field of Classification Search ............. 257/98–99, 257/680, 685–68, 723, 777
See application file for complete search history.

(56) References Cited

U.S. PATENT DOCUMENTS 4,999,484 A 3/1991 Kaneko ................... 250/208.1

(Continued)

*Primary Examiner*—Ida M Soward
(74) *Attorney, Agent, or Firm*—Kusner & Jaffe

(57) ABSTRACT

An image sensor multi-chips package structure, includes a first package including a first chip with image sensors having first bonding pads and micro lens on a first active surface, a first die receiving window and first conductive inter-connecting through holes penetrated from a first upper contact pads on a first upper surface of the first chip to a first lower contact pads on a first lower surface of the first chip, wherein a first upper build up layer on the active surface of the first chip coupling from the first bonding pads to the first upper contact pads; a second package comprising a second chip having second bonding pads on a second active surface, a second die receiving window and second conductive inter-connecting through holes penetrated from a second upper contact pads of a second upper surface of the second chip to a second lower contact pads on a second lower surface of the second chip, wherein a second upper build up layers on the second upper surface for coupling from the second bonding pads to the second upper contact pads, and second lower build up layers under the second lower surface for coupling from the second lower contact pads to terminal pads located under the second lower surface; and inter-connecting structures coupled between the first lower contact pads to the second upper contact pads.

19 Claims, 2 Drawing Sheets

U.S. PATENT DOCUMENTS

| | | | |
|---|---|---|---|
| 6,303,951 B1 | 10/2001 | Sawada et al. | 257/292 |
| 6,686,588 B1 * | 2/2004 | Webster et al. | 250/239 |
| 6,809,008 B1 | 10/2004 | Holm et al. | 438/455 |
| 6,870,208 B1 * | 3/2005 | You et al. | 257/291 |
| 6,900,429 B1 * | 5/2005 | Bai et al. | 250/239 |
| 7,030,471 B2 * | 4/2006 | Perillat | 257/666 |
| 7,279,782 B2 * | 10/2007 | Yang et al. | 257/680 |
| 2005/0046003 A1 * | 3/2005 | Tsai | 257/686 |
| 2005/0161833 A1 | 7/2005 | Takeuchi et al. | 257/775 |

* cited by examiner

SENSOR MODULE PACKAGE STRUCTURE AND METHOD OF THE SAME

RELATED APPLICATIONS

The present application is a continuation-in-part (CIP) application of (1) pending U.S. application Ser. No. 11/647,217, filed Dec. 29, 2006 and (2) pending U.S. application Ser. No. 11/933,703, filed Nov. 1, 2007, wherein Ser. No. 11/933,703 is a continuation-in-part (CIP) of U.S. application Ser. No. 11/648,688 (filed Jan. 3, 2007) and U.S. application Ser. No. 11/694,719 (filed Mar. 30, 2007), all of said foregoing applications incorporated herein by reference in their entirety.

FIELD OF THE INVENTION

This invention relates to a semiconductor package, and more particularly to package on package for Image sensor.

DESCRIPTION OF THE PRIOR ART

Complementary metal-oxide semiconductor (CMOS) devices are increasingly in demand for use with electronic devices such as digital cameras. Conventionally, these sensors have been packaged for use by mounting them to a substrate and enclosing them within a housing assembly. The housing assembly incorporates a transparent lid to allow light or other forms of radiation to be received by the sensor. The lid may be a flat window or shaped as a lens to provide optical properties. Due to the conventional structure involved, this packaging technique may be expensive and difficult to manufacture. U.S. Pat. No. 6,809,008 assigned to Motorola, Inc. (Schaumburg, Ill.) disclosed an exemplary system and method for providing an integrated photo-sensing element suitably adapted for use in CMOS imaging applications.

Integrated circuit (IC) dice or "chips" are small, generally rectangular IC devices cut from a semiconductor wafer, such as a silicon wafer, on which multiple ICs have been fabricated. Traditionally, bare IC dice are packaged to protect them from corrosion by enclosing them in die packages. Such packages work well to protect IC dice, but they can be more bulky than desirable for certain multi-chip applications requiring compact die packaging. Improvements in IC packages are driven by industry demands for increased thermal and electrical performance and decreased size and cost of manufacture. In the field of semiconductor devices, the device density is increased and the device dimension is reduced, continuously. The demand for the packaging or interconnecting techniques in such high density devices is also increased to fit the situation mentioned above. The formation of the solder bumps may be carried out by using a solder composite material. Flip-chip technology is well known in the art for electrically connecting a die to a mounting substrate such as a printed wiring board. The function of chip package includes power distribution, signal distribution, heat dissipation, protection and support, etc. As a semiconductor become more complicated, the traditional package technique, for example lead frame package, flex package, rigid package technique, cannot meet the demand of producing smaller chip with high density elements on the chip. In general, array packaging such as Ball Grid Array (BGA) packages provide a high density of interconnects relative to the surface area of the package. Typical BGA packages include a convoluted signal path, giving rise to high impedance and an inefficient thermal path which results in poor thermal dissipation performance. With increasing package density, the spreading of heat generated by the device is increasingly important. In order to meet packaging requirements for newer generations of electronic products, efforts have been expended to create reliable, cost-effective, small, and high-performance packages. Such requirements are, for example, reductions in electrical signal propagation delays, reductions in overall component area, and broader latitude in input/output (I/O) connection pad placement.

Recently, integrated circuit (chip) packaging technology is becoming a limiting factor for the development in packaged integrated circuits of higher performance. Due to the assembly package in miniature, MCM (multi-chips module) package is commonly used in the assembly package and electronic devices. Usually, the MCM package mainly comprises at least two chips encapsulated therein so as to upgrade the electrical performance of package.

U.S. Pat. No. 6,303,951 disclosed an image sensor of a multi-chip type having a plurality of photoelectric conversion chips. The gate of a load transistor of a source follower circuit of each of the photoelectric conversion chips is connected in common to one constant current source circuit. The constant current source circuit and photoelectric conversion chips are mounted on a substrate. With this structure, the common current source circuit is used for all the source follower circuits so that noises will not be generated on the photoelectric conversion chip unit basis.

U.S. Pat. No. 4,999,484 disclosed multi-chip type image sensor including, a base, a plurality of sensor chips arranged on the base so as to be staggered so that adjacent sensor chips among the sensor chips partially overlap with each other in the direction perpendicular to a direction in which the sensor chips are arranged. The sensor chips are fastened to the base by an adhesive for use in die bonding. Each of the sensor chips has a plurality of light receiving elements arranged into a line at a predetermined pixel pitch Pd. Each of the sensor chips contains silicon.

It is because that the conventional designs are complicated and the thermal dissipation is very poor, thereby decreasing the performance of the devices. The mechanical property of the dielectric layers is not "elastic/softness," it therefore leads to the CTE mismatching issue; It lacks of the stress releasing buffer layers contained therein. Therefore, the scheme is not reliable during thermal cycle and the operation of the package.

Therefore, the present invention provides a CMOS image sensor package structure to overcome the aforementioned problem and also provide the better device performance.

SUMMARY OF THE INVENTION

An object of the present invention is to provide a semiconductor device package (chip assembly) with multi-chip that provides a low cost, high performance and high reliability package.

A further object of the present invention is to provide a PoP structure for image sensor module.

Another object of the present invention is to provide a convenient, cost-effective method for manufacturing a semiconductor PoP.

In one aspect, an image sensor multi-chips package structure, includes a first package comprising a first chip with image sensors having first bonding pads and micro lens on a first active surface, a first die receiving window and first conductive inter-connecting through holes penetrated from a first upper contact pads on a first upper surface of the first chip to a first lower contact pads on a first lower surface of the first chip, wherein a first upper build up layer on the active surface of the first chip except the micro lens area and coupling from the first bonding pads to the first upper contact pads; a second package comprising a second chip having second bonding pads on a second active surface, a second die receiving window and second conductive inter-connecting through holes penetrated from a second upper contact pads of a second upper surface of the second chip to a second lower contact pads on a second lower surface of the second chip, wherein a second upper build up layers on the second upper surface for coupling from the second bonding pads to the second upper contact pads, and second lower build up layers under the second lower surface for coupling from the second lower contact pads to terminal pads located under the second lower surface; and inter-connecting structures coupled between the first lower contact pads to the second upper contact pads. The dimension of the upper chip is bigger than the one of the lower chip. An air gap is created between the first package and the second package, it further comprises solder balls/bumps formed under the second package. The materials of the soldering balls/bumps include lead-free compositions. The second chip includes DSP, ASIC, motor driver device. The first, second upper and lower build up layers include at least one conductive line. Dielectric layers are formed over the at least one conductive lines of the first, second upper and lower build up layers include at least one conductive line. It further comprises core material (substrate) formed adjacent to the first and second chips. The material of the substrate includes BT, PI, FR4, FR5, PCB, silicon, ceramic, glass, metal, or alloy. A transparency material is adhered on the top of the first upper build up layer of the first package by adhesion glue. The material of the transparency material includes glass, crystal or plastic with high transparency property. A gap is generated between the image sensor and the transparency material. The adhesion material is adhere between the edge, back side of the first and second chips and the side wall of the first and second die receiving windows.

The structure further comprises an isolating layer with water/oil repellency on top of micro lens of the image sensor. The thickness of the isolating layer is less than 0.3 um.

The image sensor multi-chips package is further formed on a printed circuit board, a lens holder on the print circuit board with conductive pads for connecting, a lens is formed atop of the lens holder and a filter is optionally located within the lens holder and between image sensor multi-chips package and the lens. The structure comprises at least one passive device formed on the print circuit board within the lens holder or outside the lens holder. The print circuit board is flexible print circuits board and the filter is IR filter.

DESCRIPTION OF THE PREFERRED EMBODIMENT

The invention will now be described in greater detail with preferred embodiments of the invention and illustrations attached. Nevertheless, it should be recognized that the preferred embodiments of the invention is only for illustrating. Besides the preferred embodiment mentioned here, present invention can be practiced in a wide range of other embodiments besides those explicitly described, and the scope of the present invention is expressly not limited expect as specified in the accompanying claims.

Figure 1:
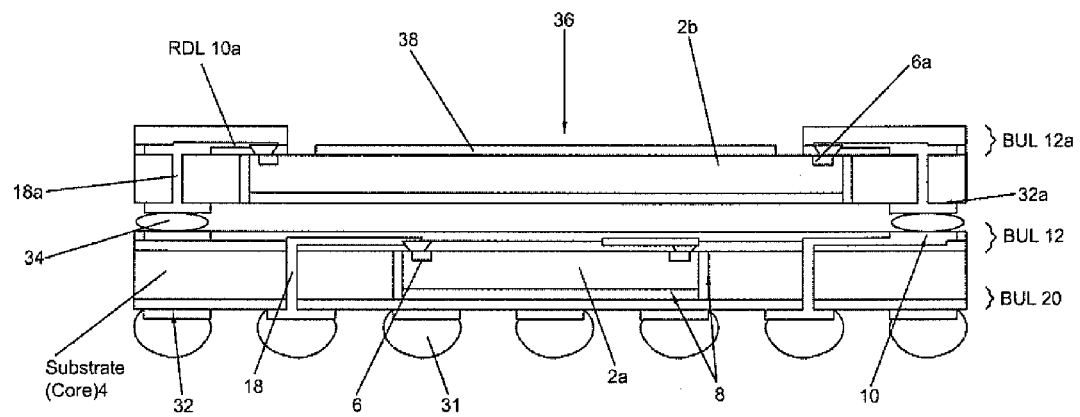
FIG. 1 is cross-sectional views showing a semiconductor chip assembly in accordance with the present invention.
Figure 2:
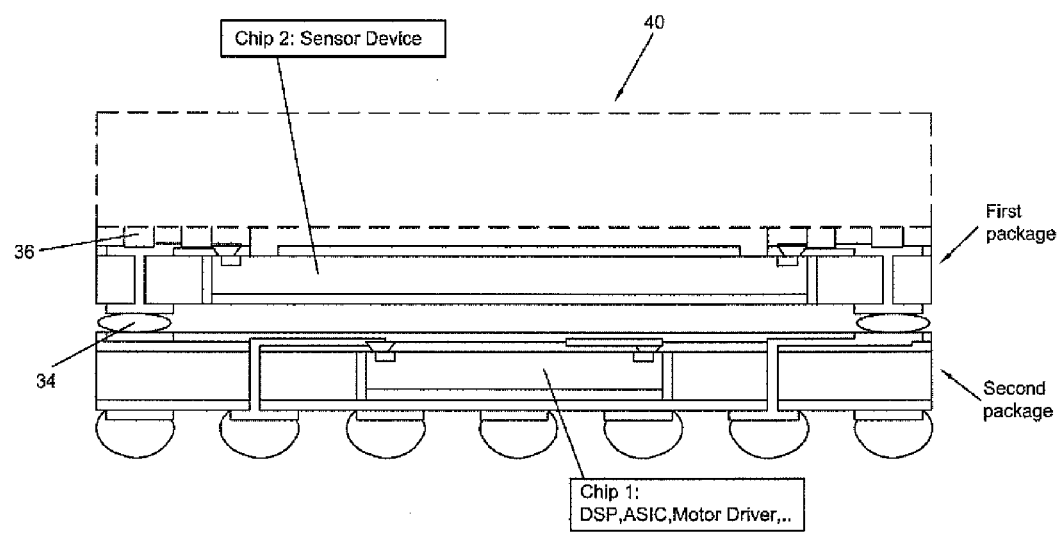
FIG. 2 is cross-sectional views showing a semiconductor chip assembly in accordance with embodiment of the present invention.
Figure 3:
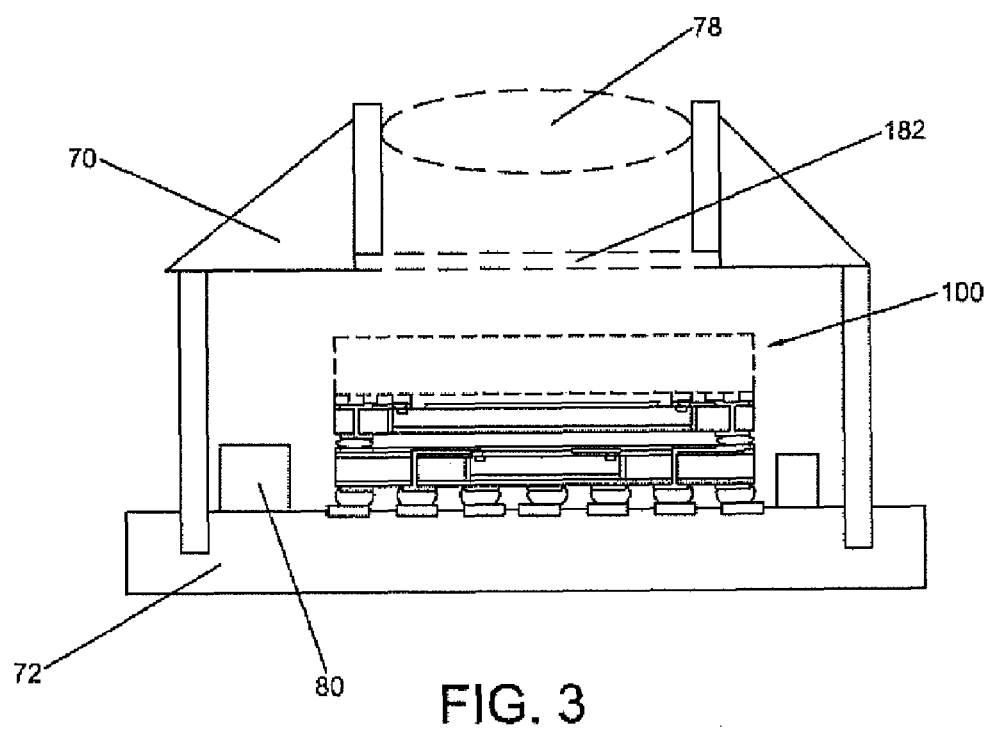
FIG. 3 illustrates a cross section view showing semiconductor chip assembly in accordance with embodiment of the present invention.

The present invention discloses a semiconductor device multi-stacking package structure. The present invention provide a semiconductor chip assembly which includes chip, conductive trace and metal inter-connecting as shown in FIGS. 1-3. The major components and the structure of each individual package are almost identical. The embodiment will be described as follows.

The individual package includes a chip 2a which is surrounded by core material 4 having interconnecting through-hole 18 penetrating through the core material 4. The chip 2a could be DSP, ASIC, motor driver device etc. Surrounding adhesion material 8 is formed between the sidewall of the chip 2a and the core material 4. The adhesion material 8 is used to adhere between the edge, back side of first and second chips and the side wall of the first and second die receiving windows. The interconnecting through-hole 18 is coupled to the bonding pads 6 of the chip 2a by redistribution layer (RDL) 10. An upper build-up layer (BUL) 12 is formed over the chip 2a, the core material 4 and the RDL 10 inside. A lower BUL 20 is formed on the lower surface as well. They could have the elastic properties to absorb the stress generated by thermal. Contact pads 32 are formed under the lower BUL 20 and aligned to the interconnecting through-holes 18, respectively. The contact metal pads 32 could be Cu/Ni/Au pads or other metal pads. Terminal bumps are coupled to the pads 32. The stacked build-up scheme is formed over the die (chip) 2a and the core paste (material) 4 which is formed adjacent to the die 2a for adhesion and protection. RDL (re-distribution layer) 10 is formed within the build-up layer 12. The BUL may refer to the cited co-pending application, and it is incorporated herein by reference.

The RDL 10 is formed by an electroplating, plating or etching method. The copper (and/or nickel) electroplating operation continues until the copper layer has the desired thickness. Conductive layers extend out of the area for receiving chip. It refers to fan-out scheme. The core materials 4 encapsulated the die 2a. It can be formed by resin, compound, silicone rubber, FR4, FR5, BT or epoxy. Upper contacts 30 are formed with the upper BUL 12 to connect to the RDL 10.

The upper individual package is similar to the lower one. Therefore, the detailed descriptions of the same elements are omitted. The upper level package and the lower level package are connected with each other through the interconnecting structure 34 such as metal, alloy. Further, the lower BUL may be omitted from the upper level package. It should be noted that there is an exposed area for the BUL 12a to expose the micro lens 38 of the upper die 2b. It includes contact pads 30a formed over the upper BUL 12a. The lower contact pad 32a of upper level package is coupled to the upper contact pads 30 of the lower level package via the solder metal inter-connecting 34. The upper die 2b could be CMOS image sensor or the like. An air gap 26 is generated between two adjacent level packages to offer better thermal dissipation, it can provide better electrical performance for image sensor device without heat interference that is generated by the (upper and/or lower) die. The bottom level package further includes solder bumps 31 coupled to the lower contact pads 32.

FIG. 2 shows an alternative embodiment of the present invention. Most of the structure is similar to the embodiment of above, except the upper level package structure. Referring to FIG. 2, the package further includes an adhesive glue 36 with specific pattern within the BUL 12a for adhering a transparent material 40 which preferably does not contact to the micro lens 38.

Preferably, the die size is decreased from top level to low level, subsequently. The smaller the chip is, the larger the core material is. Under the scheme, the core area of the bottom level package is the largest. It may strength the mechanical support.

FIG. 3 illustrates embodiment for image module. The above embodiments may be integrated into a CIS module having a lens holder 70 on a print circuit board 72 with conductive pads 74 for connecting the bumps. Preferably, print circuit board 72 includes flexible print circuit board (FPC). The multi-chip package of 100 is formed on the print circuit board 72 via the contact metal pads 74 on FPC and within the lens holder 70 by solder join (paste or Balls) by using SMT process. A lens 78 is formed atop of the holder 70 and IR filter 82 is optionally located within the lens holder 70 and between the package 100 and the lens 78. At least one passive device 80 may be formed on the FPC within the lens holder 70 or outside the lens holder 70.

Figure 4:
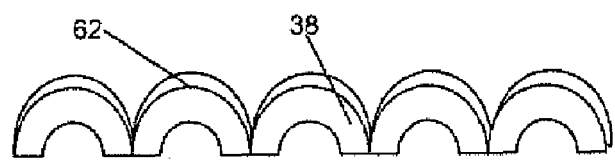
FIG. 4 illustrates a cross section view showing semiconductor chip assembly in accordance with embodiment of the present invention.

It should be note that the image sensor chip includes a micro lens 38 formed on the die. The micro lens 38 has a protection (isolating) layer 62 formed thereon, please refer to FIG. 4. The isolating layer 62 with water/oil repellency is formed on top of micro lens 38 of the image sensor, preferably, the thickness of the isolating layer 62 is less than 0.3 um as anti-reflection property.

The multi-chips package is configured with stacking structure. Panel stacking process can be applied by using soldering metal inter-connecting or by drilling through hole, followed by forming conductive interconnecting. The panel level final testing is adaptable for each panel structure, and the panel level packaging process with fan-out structure can be applied for each panel. Repairable structure is offered and it maybe repaired by de-soldering process. The passive components are stacking on top by SMT process. Side-by-side package and package stacking are possible. The present invention offers better reliability due to same CTE—coefficient of temperature extension (using the same core materials—BT or FR5) in each package and PCB.

A method of forming an image package structure for a semiconductor die assembly, comprises the steps of: preparing a first level substrate (the materials of the substrate is preferably BT, PI or FR5) having first die (sensor device having bonding pads and micro lens area) through holes window and a first conductive connecting through holes; embedding the at least one first die into the first level die through holes window of the first level substrate by attaching materials in the surrounding gap and under the at least one first die; forming first level build up layers on first upper and/or lower surfaces of the at least one first die except the micro lens area and the first level substrate to couple first level bonding pads of the at least one first die to first solder metal pads of the first level build up layers through first level conductive connecting through holes; preparing a second level substrate (the materials of the substrate is preferably BT, PI, FR4 or FR5) having a second level die through holes window and a second conductive connecting through holes; embedding at least second die into the second level die through holes windows of the second level by attaching materials in the surrounding gap and under the at least one second die; forming second level build up layers on second upper and/or lower surfaces of the second die and the second level substrate to couple second level bonding pads of the second die to second solder metal pads of the second level build up layers second level through conductive connecting through holes; printing the soldering paste (or place the solder balls) on the second solder metal pads of second upper surface of the second level package; it maybe also print the flux paste on the first solder metal pads of first lower surface of the first level package to form solder join thereon; mounting the first lower surface of the first level package onto soldering balls/bumps with fine alignment mounting system; re-flowing the soldering balls/bumps to form inter-connecting.

The method further comprises a step of sawing panels from scribe lines to separate the "PoP" package.

The other method also includes the steps of forming the inter-connecting of package on package: aligning and stacking the first and second level packages by adhesion materials; the method further comprises step of mechanically drilling the inter-connecting through holes from the first contact metal pads of first level package penetrate the core materials to second contact metal pads of second level package (also penetrate the core material of second level substrate); filling the conductive materials (can be by e-plating Cu/Ni/Au) to form inter-connecting the each contact metal pads together. Some portions of the second contact metal pads of second level package are inter-connecting together with first contact metal pads of first level package, and the other portion of the second contact pads of second level package can be connecting through the second level conductive connecting through holes of second level package.

The present invention provides better reliability in TCT (temperature cycling test), drop test, ball shear test due to the properties of the core materials, and the CTE of core materials matches with CTE of print circuit board (PCB), furthermore, the build up layers with elastic/elongation property can absorb the thermal mechanical stress during temperature cycling.

It is easy to replace the solder balls/bumps during rework process: the normal rework procedure of solder balls will not damage the top surface of package due to has isolating base.

Although preferred embodiments of the present invention have been described, it will be understood by those skilled in the art that the present invention should not be limited to the described preferred embodiment. Rather, various changes and modifications can be made within the spirit and scope of the present invention, as defined by the following claims.

Having described the invention, the following is claimed:

1. An image sensor multi-chips package structure, comprising:
   a first package comprising a first chip with image sensors having first bonding pads and micro lens on a first active surface, a first die receiving window and first conductive inter-connecting through holes penetrated from a first upper contact pads on a first upper surface of said first chip to a first lower contact pads on a first lower surface of said first chip, wherein a first upper build up layer on said active surface of said first chip except said micro lens and coupling from said first bonding pads to said first upper contact pads;
   at least a second package comprising a second chip having second bonding pads on a second active surface, a second die receiving window and second conductive inter-connecting through holes penetrated from a second upper contact pads of a second upper surface of said second chip to a second lower contact pads on a second lower surface of said second chip, wherein a second upper build up layers on said second upper surface for coupling from said second bonding pads to said second upper contact pads, and second lower build up layers under said second lower surface for coupling from said second lower contact pads to terminal pads located under said second lower surface; and inter-connecting structures coupled between said first lower contact pads to said second upper contact pads.

2. The structure of claim 1, an air gap is created between said first package and said second package.

3. The structure of claim 1, further comprising solder balls/bumps formed under said second package.

4. The structure of claim 3, wherein the materials of said soldering balls/bumps include lead-free compositions.

5. The structure of claim 1, wherein said second chip includes DSP, ASIC, motor driver device.

6. The structure of claim 1, wherein said first, second upper and lower build up layers include at least one conductive line.

7. The structure of claim 6, further comprising dielectric layers formed over said at least one conductive lines of said first, second upper and lower build up layers include at least one conductive line.

8. The structure of claim 1, further comprising core material (substrate) formed adjacent to said first and second chips.

9. The structure of claim 8, wherein the material of said substrate includes BT, PI, FR4, FR5, PCB, silicon, ceramic, glass, metal, or alloy.

10. The structure of claim 1, further comprising a transparency material adhered on the top of said first upper build up layer of said first package by adhesion glue.

11. The structure of claim 10, wherein the materials of said transparency material includes glass, crystal or plastic with high transparency property.

12. The structure of claim 10, a gap is generated between said image sensor and said transparency material.

13. The structure of claim 1, further comprising adhesion material to adhere between the edge, back side of said first and second chips and the side wall of said first and second die receiving windows.

14. The structure of claim 1, further comprising an isolating layer with water/oil repellency on top of micro lens of said image sensor.

15. The structure of claim 14, wherein the thickness of said isolating layer is less than 0.3 um.

16. The structure of claim 1, wherein said image sensor multi-chips package formed on a printed circuit board, a lens holder on said print circuit board with conductive pads for connecting, a lens is formed atop of said lens holder and a filter is optionally located within said lens holder and between image sensor multi-chips package and said lens.

17. The structure of claim 16, further comprising at least one passive device formed on said print circuit board within said lens holder or outside said lens holder.

18. The structure of claim 16, wherein said print circuits board is flexible print circuits board.

19. The structure of claim 16, wherein said filter is IR filter.

* * * * *